(12) United States Patent
Ni

(10) Patent No.: US 7,359,208 B2
(45) Date of Patent: Apr. 15, 2008

(54) USB DEVICE WITH METAL PLUG SHELL ATTACHED TO PLASTIC HOUSING

(75) Inventor: Jim Ni, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 412 days.

(21) Appl. No.: 11/213,607

(22) Filed: Aug. 26, 2005

(65) Prior Publication Data

US 2007/0076382 A1    Apr. 5, 2007

(51) Int. Cl.
*H05K 7/10* (2006.01)
*H05K 7/02* (2006.01)

(52) U.S. Cl. .............. 361/752; 361/737; 361/736; 439/76.1; 439/951; 439/660; 174/50.51; 174/50.52

(58) Field of Classification Search ........ 361/728–730, 361/736, 737, 752; 174/50.51–50.53, 520; 439/76.1, 660, 745, 946, 951
See application file for complete search history.

(56) References Cited

U.S. PATENT DOCUMENTS

| | | | |
|---|---|---|---|
| 5,400,216 | A | 3/1995 | Tsai |
| 5,941,725 | A | 8/1999 | Brennan et al. |
| 5,941,733 | A | 8/1999 | Lai |
| 6,036,544 | A | 3/2000 | Brunker et al. |
| 6,135,786 | A | 10/2000 | Johnson et al. |
| 6,241,534 | B1 | 6/2001 | Neer et al. |
| 6,309,255 | B1 | 10/2001 | Yu |
| 6,332,783 | B1 | 12/2001 | Ukiya et al. |
| 6,618,243 | B1 | 9/2003 | Tirosh |
| 6,671,808 | B1 | 12/2003 | Abbott et al. |
| 6,676,419 | B1 | 1/2004 | Lin et al. |
| 6,744,634 | B2 * | 6/2004 | Yen ............... 361/752 |
| 6,778,401 | B1 * | 8/2004 | Yu et al. ........ 361/752 |
| 6,804,749 | B2 * | 10/2004 | Chien et al. ........ 711/115 |
| 6,813,164 | B2 * | 11/2004 | Yen ............. 361/785 |
| 6,854,984 | B1 | 2/2005 | Lee et al. |
| 6,877,994 | B2 * | 4/2005 | Huang ........... 439/76.1 |
| 6,944,028 | B1 | 9/2005 | Yu et al. |
| 6,948,983 | B1 | 9/2005 | Peng |
| 6,999,322 | B1 * | 2/2006 | Lin ............ 361/752 |
| 7,004,794 | B2 | 2/2006 | Wang et al. |
| 7,035,110 | B1 * | 4/2006 | Wang et al. ....... 361/737 |
| 7,044,802 | B2 | 5/2006 | Chiou et al. |

(Continued)

*Primary Examiner*—Diego Gutierrez
*Assistant Examiner*—Dameon E Levi
(74) *Attorney, Agent, or Firm*—Bever, Hoffman & Harms, LLP; Patrick T. Bever

(57) ABSTRACT

A Universal-Serial-Bus (USB) device includes a PCBA mounted inside a molded plastic housing structure such that metal contacts are exposed on a plug portion of the housing structure, and includes a metal plug shell attached to the housing structure such that an upper wall of the metal plug shell is spaced from the metal contacts by a predetermined gap distance. A USB controller IC is mounted onto a relatively narrow portion of the PCBA under the metal contacts to reduce overall length of the USB device. The metal plug shell is molded or snap-coupled onto tabs formed on the plug portion of the housing structure. An optional locking collar secures a rear edge of the metal plug shell to the housing structure. An optional rear cover is attached over a rear opening of the housing structure and secures a rear edge of the PCBA.

18 Claims, 12 Drawing Sheets

U.S. PATENT DOCUMENTS

| | | |
|---|---|---|
| 7,052,287 B1 | 5/2006 | Ni et al. |
| 7,068,517 B2 * | 6/2006 | Yen .............................. 361/752 |
| 7,074,052 B1 * | 7/2006 | Ni et al. ..................... 439/76.1 |
| 7,090,541 B1 | 8/2006 | Ho |
| 7,095,617 B1 * | 8/2006 | Ni ............................... 361/736 |
| 7,165,998 B2 * | 1/2007 | Lee et al. .................... 439/660 |
| 7,172,460 B2 * | 2/2007 | Zhao et al. .................. 439/607 |
| 7,249,978 B1 * | 7/2007 | Ni ............................... 439/660 |
| 2003/0100203 A1 | 5/2003 | Yen |
| 2004/0198079 A1 | 10/2004 | Aronson et al. |
| 2005/0085129 A1 | 4/2005 | Chiou et al. |

* cited by examiner

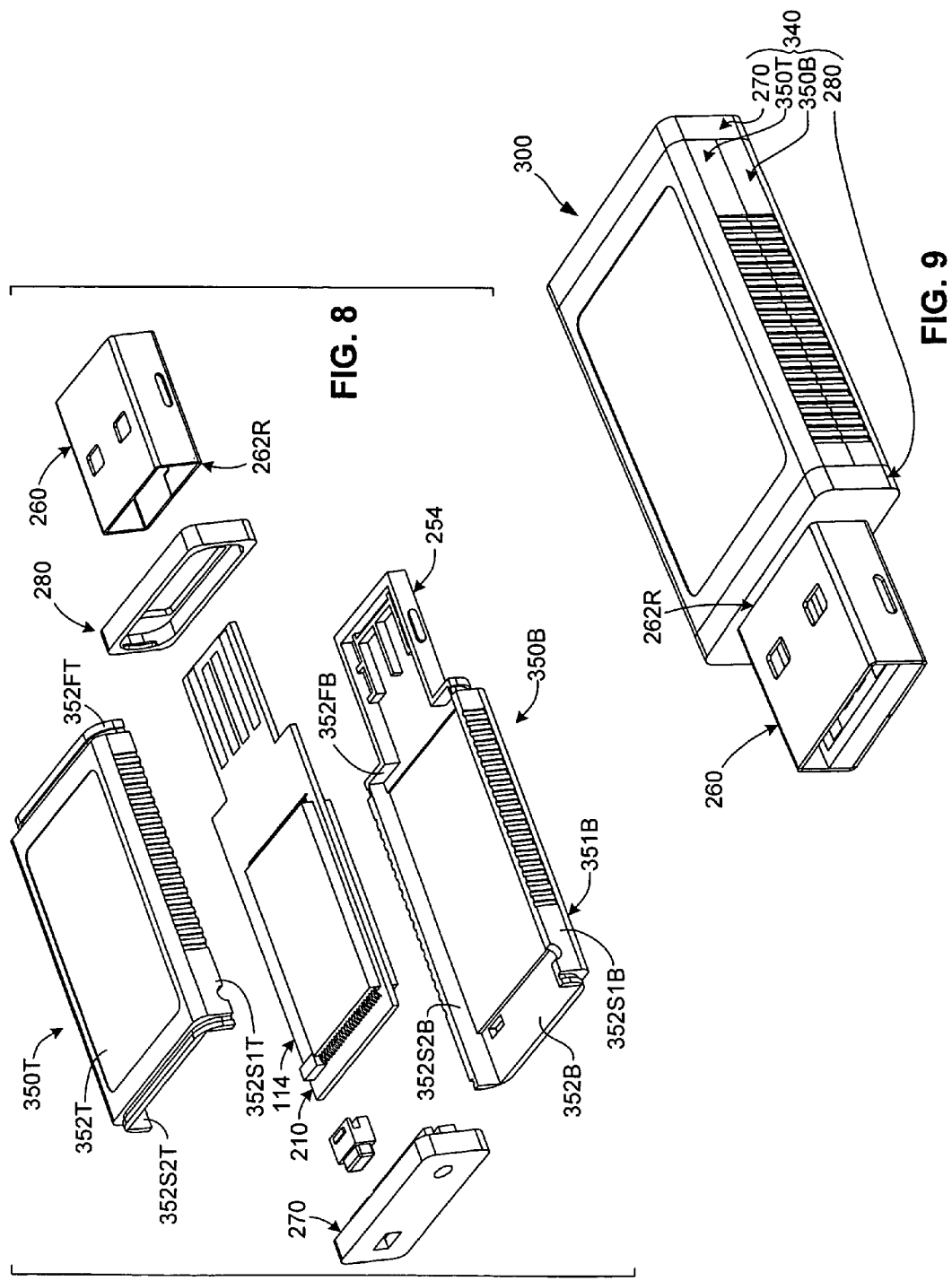

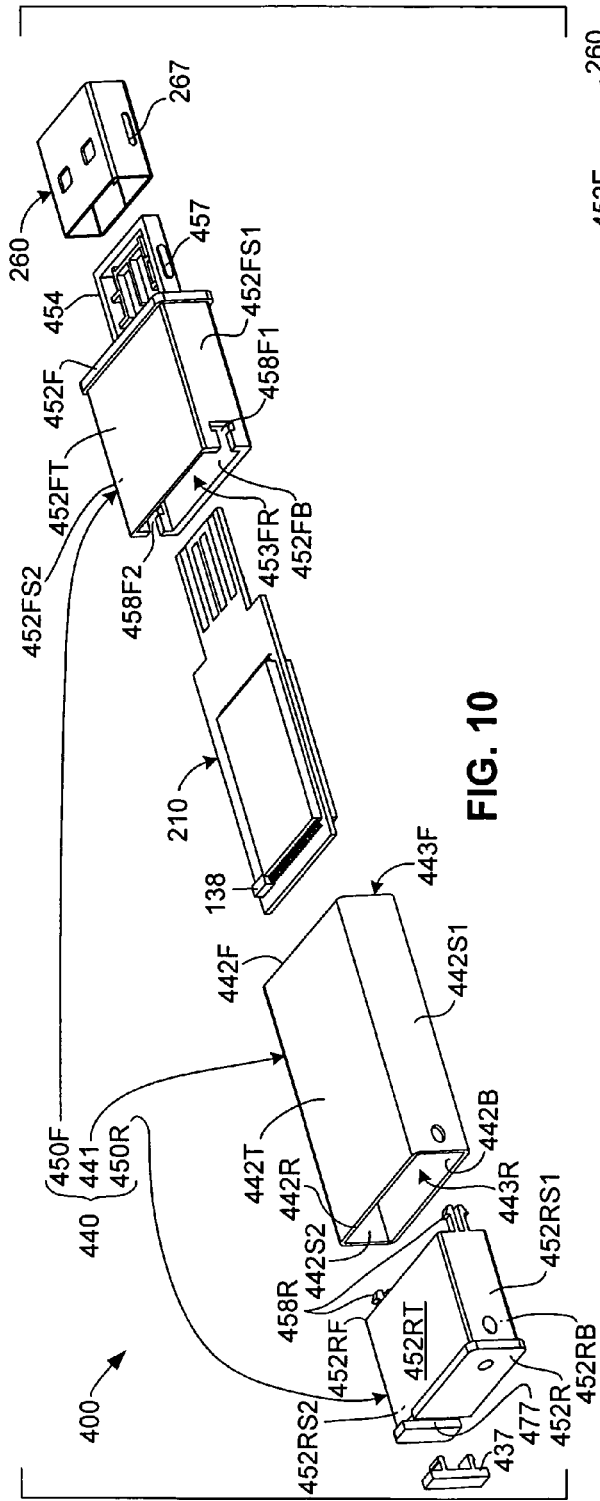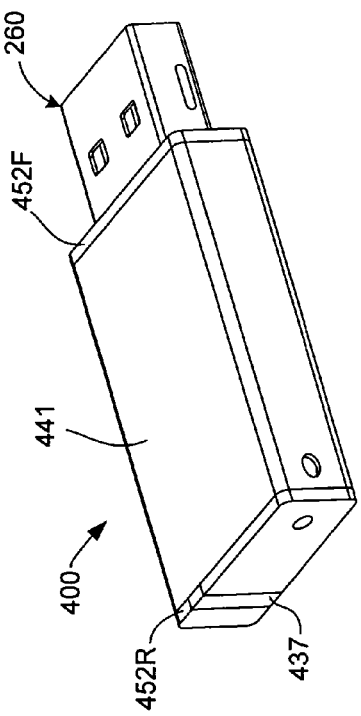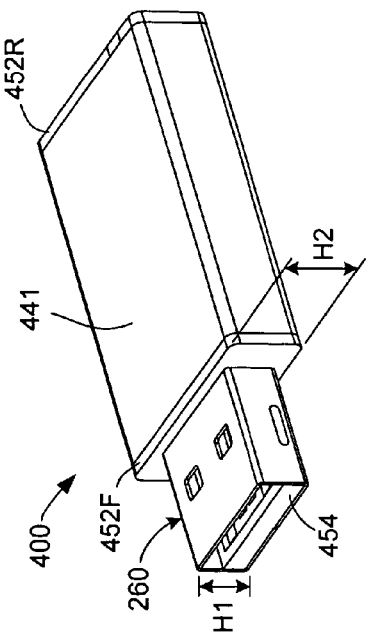

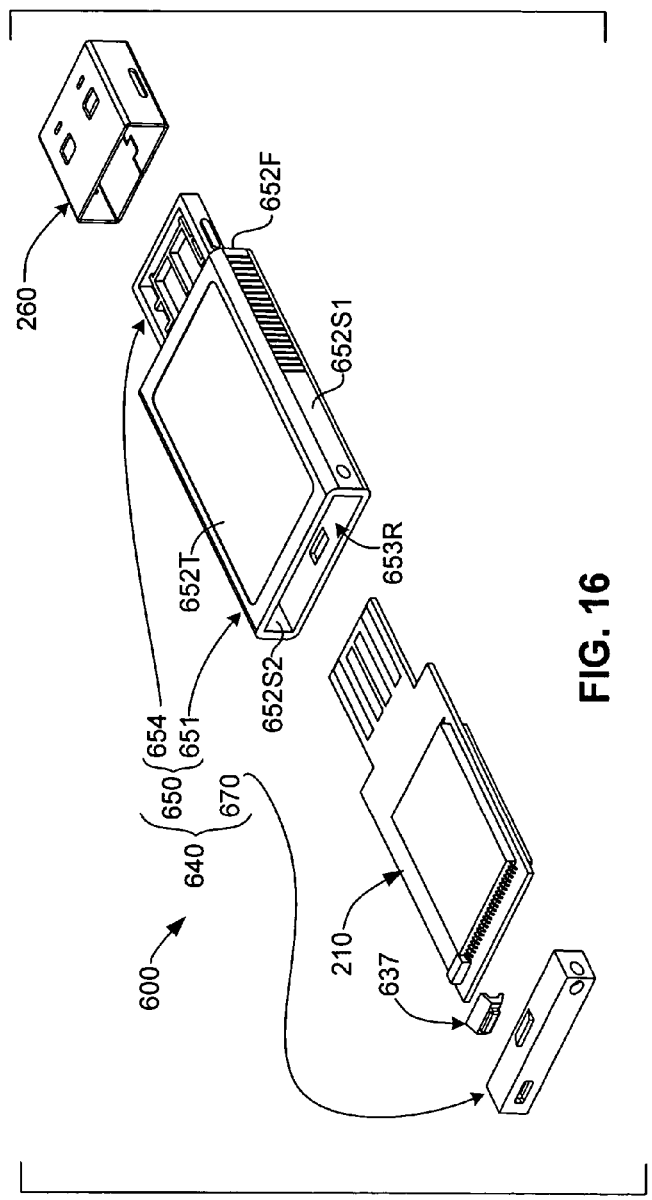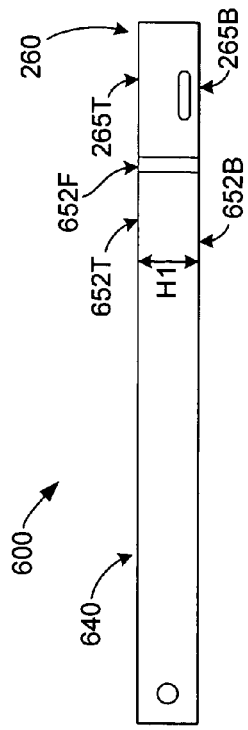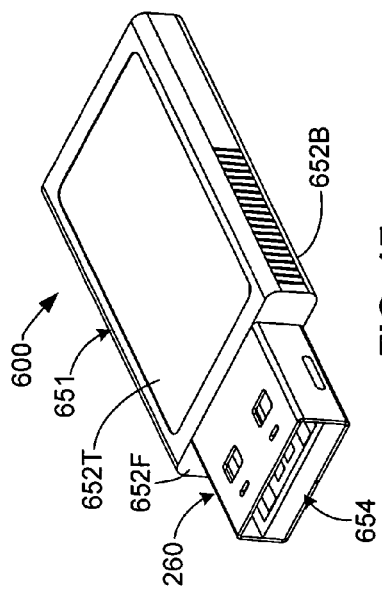
FIG. 16
FIG. 18
FIG. 17

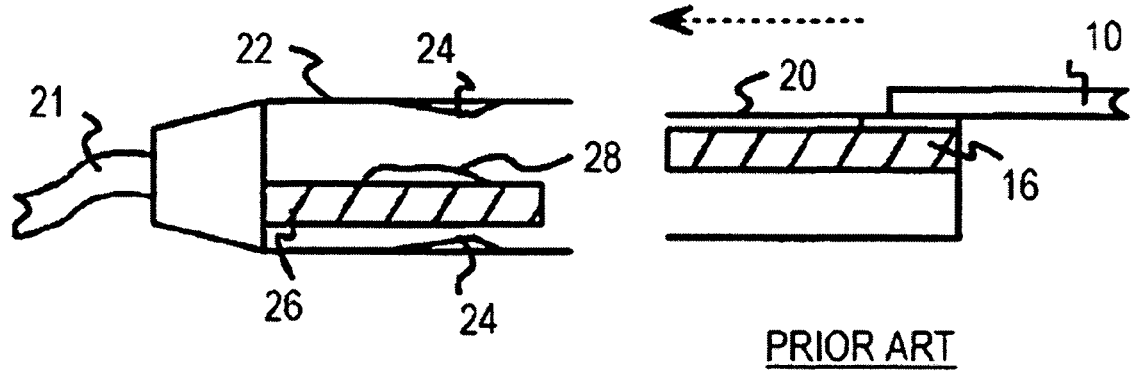
FIG. 21(A)  PRIOR ART
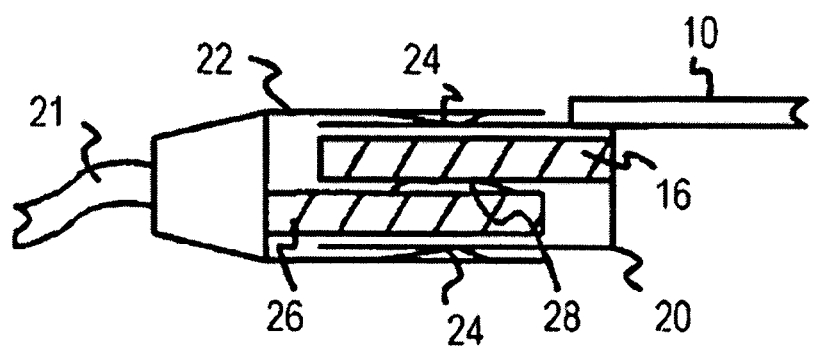
PRIOR ART  FIG. 21(B)

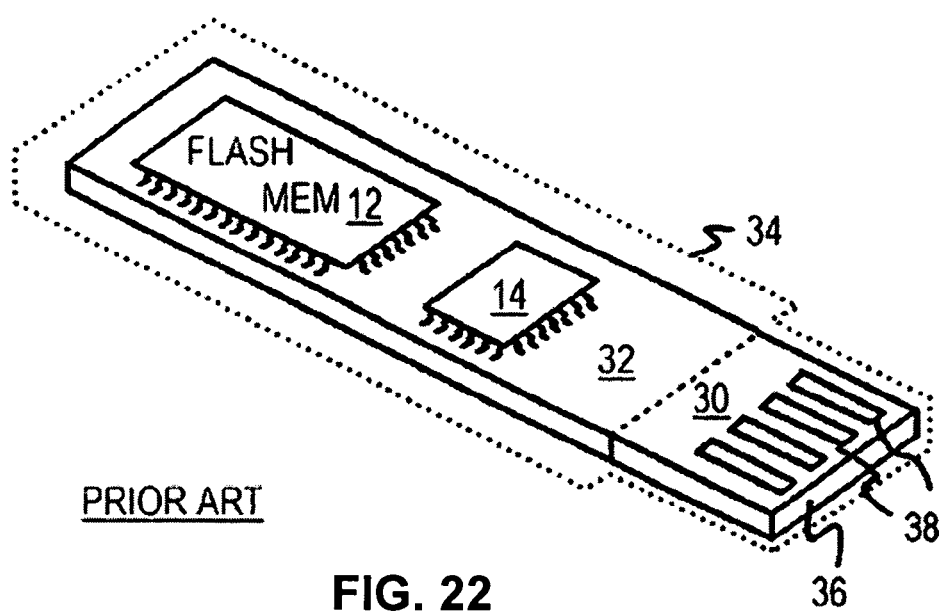
PRIOR ART
FIG. 22
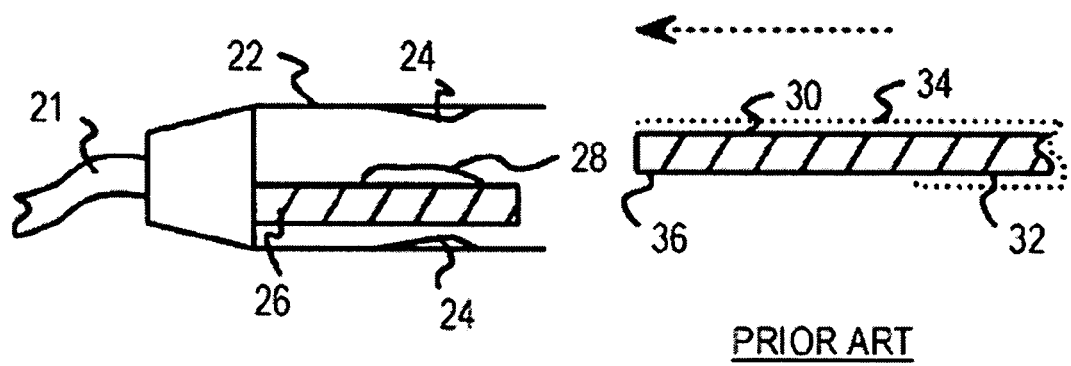
PRIOR ART
FIG. 23(A)
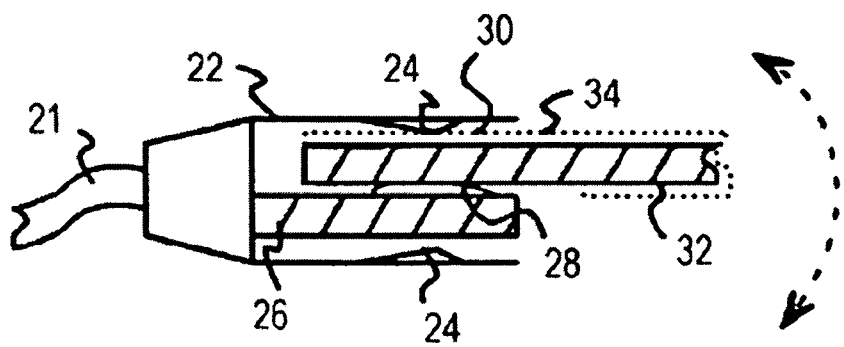
PRIOR ART   FIG. 23(B)

USB DEVICE WITH METAL PLUG SHELL ATTACHED TO PLASTIC HOUSING

FIELD OF THE INVENTION

This invention relates to portable electronic devices, and more particularly to portable electronic devices that utilize the Universal-Serial-Bus (USB) specification.

BACKGROUND OF THE INVENTION

Rapid advances in technology in several areas have converged to enable small, portable memory cards with vast capacities. Flash memory technologies such as those using electrically-erasable programmable read-only memory (EEPROM) have produced chips storing 128 M-Bytes or more. Small flash-memory cards have been designed that have a connector that can plug into a specialized reader, such as for compact-flash, secure-digital, memory stick, or other standardized formats.

More recently, flash memory cards are being sold that contain a USB connector. Such USB-flash memory cards do not require a specialized reader but can be plugged into a USB connector on a host system, such as a personal computer (PC). These USB-flash memory cards can be used in place of floppy disks. A USB-flash card can have a capacity of more than ten floppy disks in an area not much larger than a large postage stamp.

FIG. 20(A) shows a prior-art flash-memory card with a conventional male USB connector. Flash memory chip 12 may be a 128 Mega-byte non-volatile chip or may have some other capacity. Controller chip 14 contains a flash-memory controller that generates signals to access memory locations within flash memory chip 12. Controller chip 14 also contains a USB interface controller that serially transfers data to and from flash memory chip 12 over a USB connection.

Male USB connector 20 is mounted on a board 10, which is a small circuit board with chips 12, 14 mounted thereon. Multi-layer printed-circuit board (PCB) technology can be used for board 10. A plastic case (not shown) can surround board 10.

Male USB connector 20 contains a small connector substrate 16, which is often white ceramic, black rigid plastic, or another sturdy substrate. Connector substrate 16 has four or more metal contacts 18 formed thereon. Metal contacts 18 carry the USB signals generated or received by controller chip 14. USB signals include power, ground, and serial differential data D+, D−.

Male USB connector 20 contains a metal case (plug shell) 11 that wraps around connector substrate 16. The plug shell touches connector substrate 16 on three of the sides of connector substrate 16. The top side of connector substrate 16, holding metal contacts 18, has a large gap to the top of the plug shell. On the top and bottom of this metal wrap are formed holes 15. USB connector 20 is a type-A USB connector.

FIG. 20(B) shows a female USB socket connector 22. Female USB socket connector 22 can be an integral part of a PC or other host system, or can be connected by cable 21 to such a host system. Another connector substrate 26 contains four metal contacts 28 that make electrical contact with the four metal contacts 18 of the male USB connector 20 of FIG. 20(A). Connector substrate 26 is wrapped by a metal case, but small gaps are between the metal case and connector substrate 26 on the lower three sides.

Locking is provided by metal springs 24 in the top and bottom of the metal plug shell. When male USB connector 20 of FIG. 20(A) is flipped over and inserted into female USB socket connector 22 of FIG. 20(B), metal springs 24 lock into holes 15 of male USB connector 20.

FIGS. 21(A) and 21(B) are cross-sections highlighting connections between male and female USB connectors. Female USB socket connector 22 is on the left while male USB connector 20 is being inserted from the right. Male USB connector 20 is flipped over relative to the view of FIG. 20(A). Metal contacts 18 are formed on the lower surface of connector substrate 16 on male USB connector 20, while metal contacts 28 are formed on the upper surface of connector substrate 26 on female USB socket connector 22. Thus the metal contacts face one another to allow for electrical contact when male USB connector 20 is inserted into female USB socket connector 22 as shown in FIG. 21(B).

Metal springs 24 formed on the metal case surrounding connector substrate 26 on female USB socket connector 22 fit into holes on the plug shell of male USB connector 20. This helps to lock the connectors together.

A problem associated with the production of conventional male USB devices that utilize standard male USB plug connectors typically require lead-based soldering methods to attach the standard plug structure (e.g., substrate 16 and plug shell 11) to circuit board 10. Lead (Pb) is recognized as a hazardous material, and may at some point in time be banned from use. Lead-free soldering requires higher peak temperatures (about 240° C.) that can shrink or warp plastic substrates, thereby making such conventional USB plug connector structures unsuitable for lead-free fabrication processes.

FIG. 22 shows a prior-art USB flash memory card using a low-profile USB connector that avoids the need for attaching a separate substrate and plug shell to a circuit board by integrating male USB connector 30 with board 32, and by omitting the plug shell entirely. Board 32 is a PCB that has flash memory chip 12 and controller chip 14 mounted on the upper surface thereof (i.e., on the same surface as contacts 38). Board 32 is extended to include male USB connector 30, which has metal contacts 38 formed on end 36 of board 32. The width and thickness of board 32 at end 36 containing male USB connector 30 is designed to approximately match that of connector substrate 16 of FIG. 20(A). Plastic case 34 can enclose board 32 but have an opening for metal contacts 38. Plastic case 34 can cover the bottom and sides of male USB connector 30 up to end 36 to emulate portions of the metal case of the male USB connector of FIG. 20(A).

FIGS. 23(A) and 23(B) show cross-sections of the prior-art lower-profile USB connector being inserted into a standard female USB connector. Board 32 that has male USB connector 30 formed on end 36 is flipped over from the view shown in FIG. 22, and end 36 is inserted into female USB socket connector 22 from the right side.

Metal contacts 38 are located on the lower surface of male USB connector 30. Plastic case 34 has an opening on the lower surface of male USB connector 30 to expose the metal contacts so they can make electrical connection with metal contacts 28 on the upper surface of connector substrate 26 of female USB socket connector 22 when inserted as shown in FIG. 23(B).

Plastic case 34 helps to fill the gate between board 32 and the top edge of the metal case of female USB socket connector 22. However, no holes are provided in plastic case 34, so metal springs 24 are pushed up slightly when male USB connector 30 is inserted into female USB socket connector 22. Plastic case 34 is also formed along the thin edges of board 32 and helps to fill in the gaps between connector substrate 26 and the sides of the metal case of female USB socket connector 22 that are above and below the plane of FIG. 23(B).

While USB connector 30 can be less expensive and smaller than the standard USB connector and avoids the need for plug shell, it can have the undesirable characteristic of wobbling in the female USB connector socket, and exposes contacts 38 to damage.

What is needed is a reduced length USB device having a male USB connector plug that avoids the need for soldering the plug shell to the circuit board.

SUMMARY OF THE INVENTION

The present invention is directed to a USB device in which a printed circuit board assembly (PCBA) is mounted inside a plastic housing structure such that integrated circuits (IC) mounted on a body of the PCBA are protectively enclosed inside the housing structure, and metal contact pads formed on the PCBA are exposed through an opening formed on a plug portion of the housing structure. The combined PCBA and plastic housing structure assembly facilitate inexpensive production. In addition, a metal plug shell is attached to the housing structure and extends over the plug portion such that an upper wall of the metal plug shell extends over the plug portion, and the metal contacts are exposed in a gap defined between the plug portion and the upper wall of the metal plug shell. The metal plug shell serves to protect the exposed metal contacts and to facilitate secure connection to a host USB female connector. By securing the metal plug directly to the plastic housing structure, the need for soldering the plug shell to the PCBA is avoided, as in conventional manufacturing methods, thus facilitating solder-free production of the PCBA.

In accordance with an aspect of the present invention, the metal plug shell is an elongated box-like structure including opposing upper and lower walls and opposing side walls that form rectangular edges defining front and rear openings. In some embodiments, the side walls of the metal plug shell are snap coupled onto the plug portion of the housing structure. In specific embodiments, the side walls define slots that receive tabs formed on the plug portion, whereby the metal plug shell is snap-coupled onto the plug portion such that the rear edge of the metal plug shell abuts the front wall of a relatively wide handle portion of the housing structure. The lower wall of the metal plug shell abuts the lower surface of the plug structure, and the upper wall of the metal plug shell is maintained over the metal contacts at a distance determined by USB standards (i.e., such that the metal contacts are accessible through the front opening of the metal plug shell when the USB device is inserted into a standard female USB socket connector). Because the metal plug shell is held by the tabs against the front wall of the handle portion and the lower wall of the plug portion, the metal plug shell is reliably rigidly held against the housing structure in the proper USB-defined orientation without requiring connection of the plug shell to the PCBA, as required in conventional USB devices. In some embodiments, a locking ring is mounted onto the front wall of the handle portion over the rear edge of the metal plug shell to further secure the metal plug shell to the housing structure in a cost effective and easily assembled manner. When the locking ring is slipped over the metal plug shell and secured to the front edge of the housing body portion, at least a portion of the metal plug shell (i.e., near the rear edge) extends into the central opening, thereby further maintaining the rear edge of the metal shell in its proper position.

In accordance with another aspect of the present invention, a USB controller IC is mounted at least partially on the relatively narrow PCB plug section of the PCBA, and in one specific embodiment below the contact pads to facilitate a reduced length of the USB device. The PCBA includes a printed circuit board (PCB) a relatively wide PCB body (rear) section and the relatively narrow PCB plug (front) section, which extends from a front edge of the PCB body section. The metal contacts are disposed on the upper surface of the PCB plug section, and various USB-compatible integrated circuits (ICs) are mounted on the upper and/or lower surfaces of the PCB. The USB controller IC, which is electrically connected to the metal contacts and controls USB-defined communication operations between the USB device and a host, is mounted onto the lower surface of the PCB at least partially on the PCB plug section, and in one embodiment is located below the metal contacts. By positioning the USB controller IC on the lower surface of the PCB plug section, and in particular below the metal contacts, instead of on the PCB body section as in conventional USB devices, the PCB body section can be made smaller (i.e., because the space conventionally used for the IC controller is no longer needed), thereby allowing a reduction in the overall length of the PCB body section. As such, this arrangement facilitates the production of shorter USB devices that require less material and, hence, are less expensive to manufacture.

In accordance with alternative embodiments, the housing structure includes either a single-piece, molded plastic housing structure having a hollow handle portion that receives the PCBA through a rear opening thereof, a two-part housing structure that is assembled over the PCBA, or a three-part housing structure including a tube-like structure that mounts over the plastic housing structure. In some embodiments, a rear cap is mounted over the rear opening of the plastic housing structure, and includes a PCB holder that maintains the rear edge of the PCBA in a predefined optimal position inside the plastic housing body, thus protecting the PCBA from shock damage. In one embodiment, a two-part housing structure includes a lower housing portion having a lower handle wall and first side handle wall portions extending perpendicular to side edges of the lower handle wall, and an upper housing portion including an upper handle wall and second side handle wall portions extending perpendicular to the upper handle wall, where the upper housing portion is mounted over the lower housing portion such that the first side wall portions mate with the second side wall portions to form an enclosure over the PCBA. In other embodiments, a housing assembly includes hollow box-like front and rear plastic housing portions that are mounted over opposite ends of the PCBA and are snap-coupled together inside of a metal tubing, which provides both further protection to the enclosed PCBA and an esthetically desirable appearance.

In accordance with alternative embodiments, a low profile (e.g., 4.5 mm) housing includes upper and lower walls that are coplanar with upper and lower walls of the metal plug shell.

In yet another embodiment, the disclosed USB device structures may be utilized to facilitate wireless (e.g., Bluetooth) communications.

BRIEF DESCRIPTION OF THE DRAWINGS

These and other features, aspects and advantages of the present invention will become better understood with regard to the following description, appended claims, and accompanying drawings, where:

FIG. 8 is an exploded perspective view showing an exemplary USB device according to another embodiment of the present invention;

FIG. 9 is a top side perspective view showing the USB device of FIG. 8 in an assembled state;

FIG. 10 is an exploded perspective view showing an exemplary USB device according to another embodiment of the present invention;

FIG. 11 is a top front perspective view showing the USB device of FIG. 10 in an assembled state;

FIG. 12 is a bottom rear perspective view showing the USB device of FIG. 10 in an assembled state;

FIG. 16 is an exploded perspective view showing an exemplary USB device according to another embodiment of the present invention;

FIG. 17 is a top front perspective view showing the USB device of FIG. 16 in an assembled state;

FIG. 18 is a simplified side elevation view showing the USB device of FIG. 16;

FIGS. 21(A) and 21(B) are cross-sections highlighting connections between male and female USB connectors;

FIG. 22 shows a prior-art USB flash memory card using a USB connector; and

FIGS. 23(A) and 23(B) show cross-sections of the prior-art USB connector of FIG. 22 being inserted into a standard female USB connector socket.

DETAILED DESCRIPTION OF THE DRAWINGS

The present invention relates to an improvement in USB connectors. The following description is presented to enable one of ordinary skill in the art to make and use the invention as provided in the context of a particular application and its requirements. As used herein, directional terms such as "upper", "upwards", "lower", "downward", "front", and "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
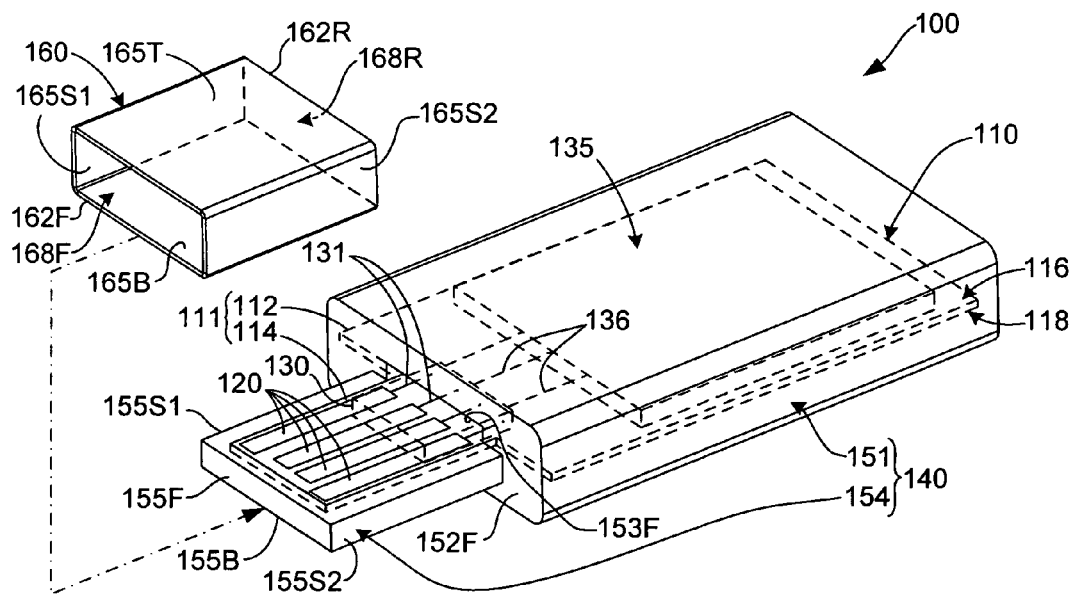
FIG. 1 is a top side partial exploded perspective view showing a USB device according to a simplified embodiment of the present invention.
Figure 2:
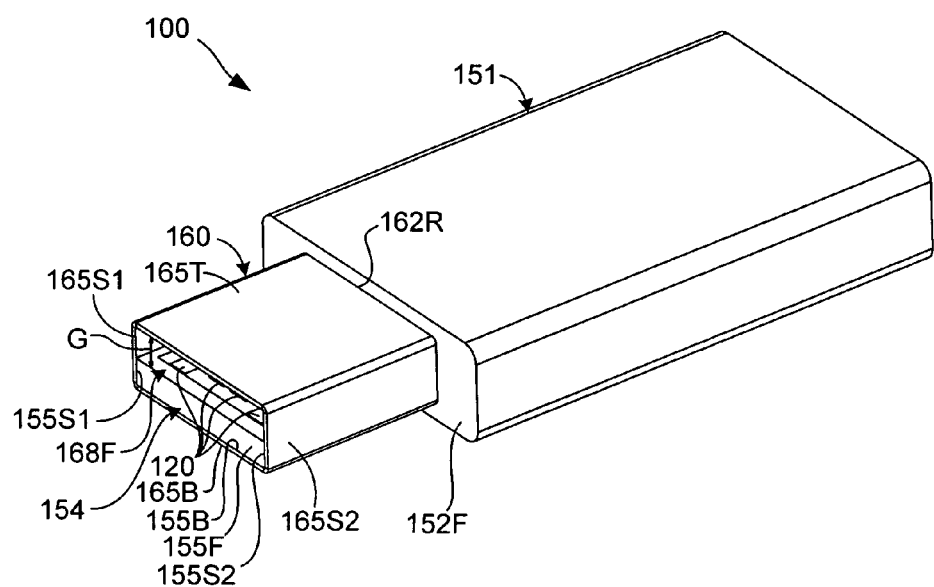
FIG. 2 is a top side perspective view showing the USB device of FIG. 1.

FIGS. 1 and 2 are top exploded and assembled perspective views, respectively, showing a Universal-Serial-Bus (USB) device 100 according to a generalized embodiment of the present invention. USB device 100 generally includes a printed circuit board assembly (PCBA) 110, a plastic housing structure 140 that is fixedly mounted over PCBA 110, and a metal plug shell 160 that is mounted onto plastic housing structure 140 in the manner described below.

Referring to the upper portion of FIG. 1, PCBA 110 includes a printed circuit board (PCB) 111 including a relatively wide PCB body section 112 and a relatively narrow PCB plug section 114 that extends from a front end of PCB body section 112. PCB 111 is a substantially flat substrate, and has opposing sides that are referred to below as upper surface 116 and lower surface 118. Formed on upper surface 116 in plug section 114 are four metal contacts 120. Metal contacts 120 are shaped and arranged in a pattern established by the USB specification. A control integrated circuit (IC) 130 is mounted on lower surface 118, and one or more auxiliary ICs 135 (e.g., flash memory devices and/or RF communication circuits) are respectively mounted on upper surface 116 and lower surface 118. ICs 130 and 135 are electrically connected to each other and to metal contacts 120 by way of metal traces 131 and 136, respectively (a few traces are depicted in FIG. 1 in a simplified manner by dashed lines for illustrative purposes). PCB 111 is formed in accordance with known PCB manufacturing techniques such that metal contacts 120 and ICs 130 and 135 (as well as zero or more other circuit components, which are omitted for brevity) are electrically interconnected by a predefined network including conductive traces 131 and 136 and other conducting structures (e.g., metal "vias" that extend between upper surface 116 and lower surface 118 through PCB 111) that are sandwiched between multiple layers of an insulating material (e.g., FR4) and adhesive.

Referring to FIG. 1, housing structure 140 is a box-like structure secured over the PCBA 110, and includes a relatively wide handle portion 151 and a relatively narrow plastic plug portion 154 extending from a front handle wall 152F of handle portion 151. PCB body section 112 of PCBA 110 is enclosed inside handle portion 151, and PCB plug section 114 extends through an opening 153F defined by a front handle wall 152F, and is supported between opposing side walls 155S1 and 155S2 and over a lower plug wall 155B of plug portion 154 such that metal contacts 120 face away from plug portion 154, thereby exposing metal contacts 120 for contact with a host system.

As shown in FIGS. 1 and 2, in one embodiment metal plug shell 160 is a box-like metal structure having opposing side walls 165S1 and 165S2, and opposing upper and lower walls 165T and 165B that are respectively integrally connected to upper and lower ends (edges) of the shell side walls. In an alternative embodiment (not shown), lower shell wall 165B may be omitted, although the resulting structure may not provide sufficient rigidity. The upper, lower and side shell walls collectively form a front edge 162F defining a front opening 168F, and collectively form a rear edge 162R defining a rear opening 168R. In accordance with an aspect of the present invention, as depicted in FIG. 2, a metal plug shell 160 is fixedly connected to housing structure 140 such that rear edge 162R abuts front handle wall 152F, lower shell wall 165B abuts lower wall 155B of plug portion 154, side shell walls 165S1 and 165S2 respectively abut side walls 155S1 and 155S2 of plug portion 154, and upper wall 165T extends over the upper surface of PCB plug section 114 from front handle wall 152F to a point located over front wall 155F of plug portion 154. In addition, upper wall 165T is spaced from PCB plug section 114 such that metal contacts 120 are exposed in a gap G defined between PCB plug section 114 and upper wall 165T, thereby facilitating contact between metal contacts 120 and corresponding pins of a host system by inserting the connector portion of the host system through front opening 168F. By providing plastic housing structure 140 in which metal contacts 120 formed directly on PCBA 110 are exposed in gap G, and by mounting metal plug shell 160 directly onto housing structure 140 such that the side and lower walls of metal plug shell 160 abut corresponding side and lower walls of plug portion 154, the present invention facilitates the inexpensive production of durable USB devices without soldering any structures to PCBA 110, as required in conventional male USB connectors, thereby facilitating the production of lead-free USB devices.

Figure 3:
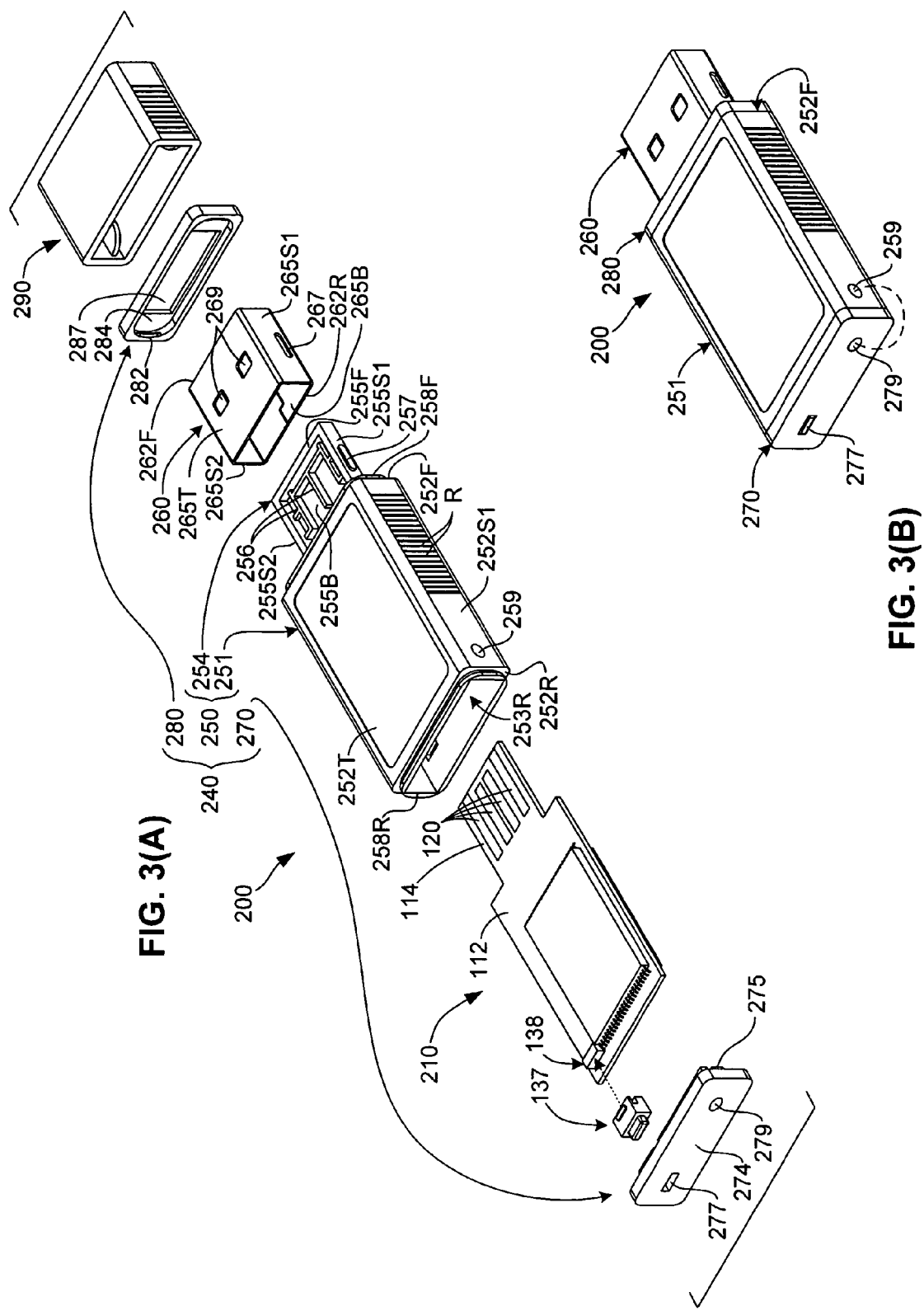
FIGS. 3(A) and 3(B) are exploded and assembled perspective views showing a USB device according to a specific embodiment of the present invention.

FIGS. 3(A) and 3(B) are exploded and assembled perspective views, respectively, showing a USB device 200 in accordance with a specific embodiment of the present embodiment. USB device 200 includes PCBA 210, a housing assembly 240, a metal plug shell 260, and an optional protective cap 290. PCBA 210 is similar to PCBA 110 (described above), but includes additional features set forth below. Housing assembly 240 includes a molded plastic housing 250, a rear cover 270, and a locking ring 280. Metal plug shell 260 is similar to metal plug shell 160 (discussed above), but includes additional features set forth below. Protective cap 290 is a molded plastic structure that mounts onto the front end of USB device 200 to protect metal plug shell 260 when not in use.

Figure 4:
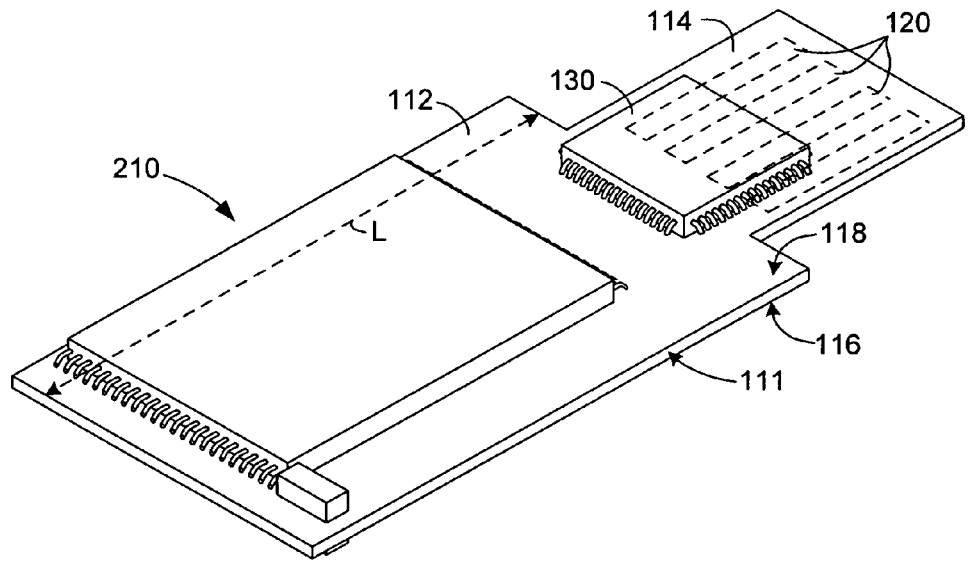
FIG. 4 is a perspective view showing a PCBA utilized in the USB device of FIG. 3 according to an aspect of the present invention.
Figure 5A:
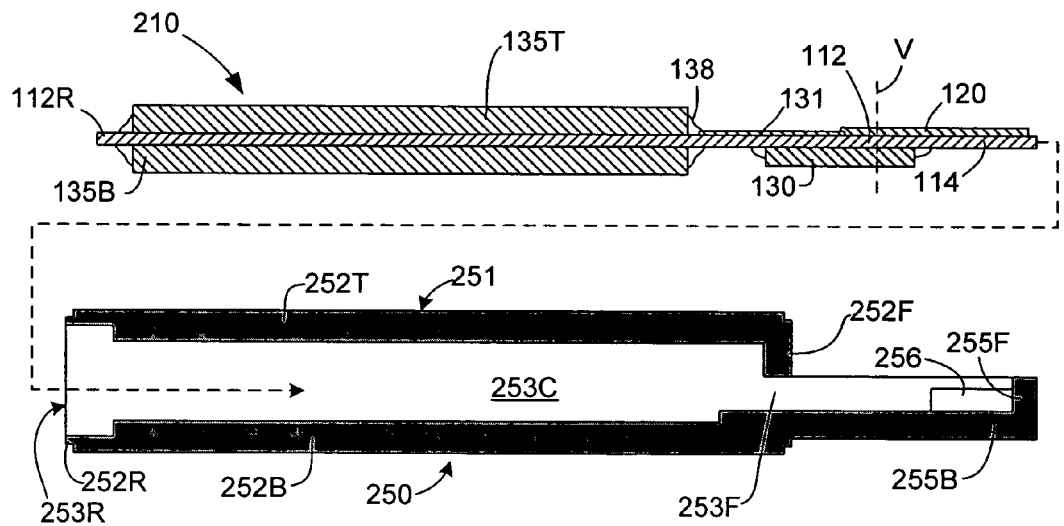
FIGS. 5(A) and 5(B) are exploded and assembled cross-sectional side views showing the USB device of FIG. 1.

Referring to FIGS. 3(A) and 4, PCBA 210 is similar to PCBA 110 (described above), and thus structures and features similar to those described above are identified with the same reference numerals. As depicted in FIGS. 4 and 5(A), in accordance with an aspect of the present invention, a USB controller IC 130 is mounted at least partially on relatively narrow PCB plug section 114 of PCBA 210, and as indicated by the dashed vertical line "V" in FIG. 5(A), at least a portion of USB controller IC 130 is located directly below contact pads 120. The positioning of USB controller IC 130 on plug portion 114 is facilitated by the smaller footprint of USB controllers. By positioning USB controller IC 130 on lower surface 118 of PCB plug section 114, and in particular below metal contacts 120, instead of on PCB body section 112 as in conventional USB devices, the overall length L of PCB body section 112 can be shortened, thereby facilitating the production of shorter USB devices that require less material and, hence, are less expensive to manufacture.

Figure 5B:
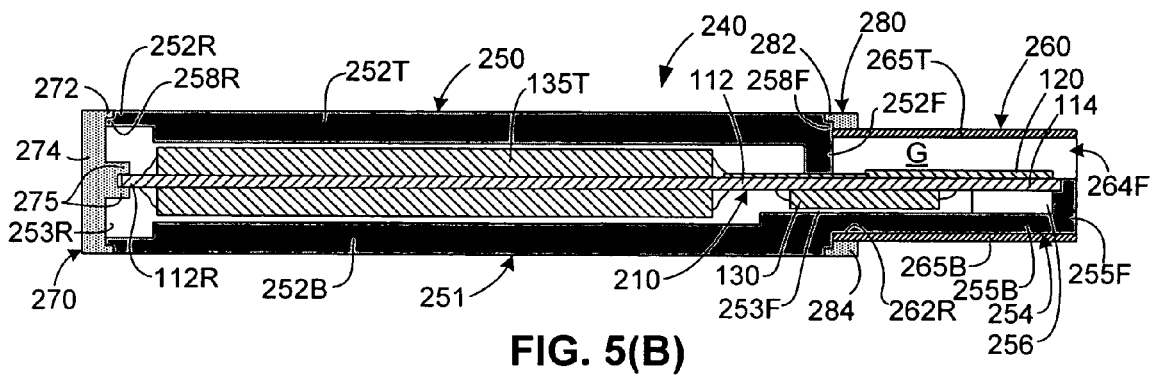

According to another aspect of the present embodiment, housing structure 250 is a single-piece, molded plastic structure including a relatively wide handle portion 251 and a relatively narrow plastic plug portion 254 that extends from a front handle wall 252F of handle portion 251. Handle portion 251 includes opposing upper and lower walls 252T and 252B that are integrally molded to opposing upper and lower edges of opposing side walls 252S1 and 252S2, thereby forming a box-like enclosure that is accessible through a rear opening 253R defined by a rear edge 252R. During assembly, PCBA 210 is inserted through rear opening 253R until PCB body section 112 is received inside handle portion 251. Front handle wall 252F defines an opening 253F through which PCB plug section 114 protrudes during the assembly process such that metal contacts 120 are exposed on plug portion 254. Plug portion 254 includes a plug lower wall 255B, opposing side walls 255S1 and 255S2, a front wall 255F, and several plug support ribs 256 that extend upward from an upper surface of plug lower wall 255B behind front wall 255F and between side walls 255S1 and 255S2. As indicated in FIGS. 5(A) and 5(B), when PCBA 210 is fully inserted into housing structure 250, the front edge of PCB plug section 114 extends through a front opening 253F defined by front handle wall 252F, and is supported by tabs 256. As indicated in FIG. 5(B), USB controller IC 130 extends into a hollow region defined between the side walls of plug portion 254 and behind ribs 256.

Figure 6A:
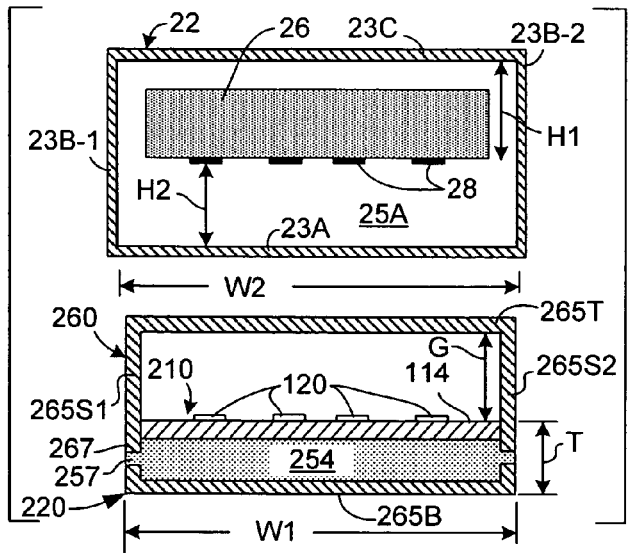
FIGS. 6(A) and 6(B) are cross-sectional side views showing a plug structure of the USB device of FIG. 3 and a standard female USB connector socket.
Figure 6B:
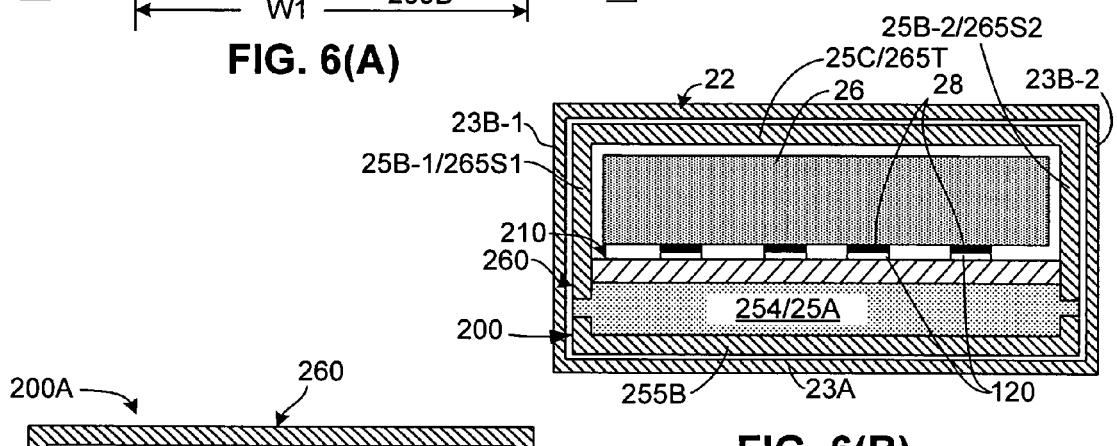

Referring again to FIG. 3(A), metal plug shell 260 includes a piece of sheet metal that is stamped and folded according to known techniques to form opposing shell side walls 265S1 and 265S2 that are integrally connected along their respective upper and lower edges to an upper shell wall 265T and a lower wall 265B. In accordance with an aspect of the invention, side walls 265S1 and 265S2 define slots 267 that receive tabs 257 protruding from side walls 255S1 and 255S2 of plug portion 254 when metal plug shell 260 is mounted over plug portion 254, whereby metal plug shell 260 is conveniently snap-coupled onto housing structure 250 such that rear edge 262R of metal plug shell 260 abuts front handle wall 252F. In particular, as indicated in FIGS. 6(A) and 6(B), each tab 257 becomes engaged with a corresponding slot 267, thus securing metal plug shell 260 to plug portion 254 such that lower wall 265B of metal plug shell 260 abuts the lower surface of lower wall 255B, and upper wall 265T of metal plug shell 260 supported by side walls 265S1 and 265S2 such that a gap G is provided between metal contacts 120 and upper wall 265T. Alternatively, tabs 257 can be recessing (instead of protruding) on side walls 255S1 and 255S2. After proper alignment metal plug shell 260 can be fixedly attached to plug portion 254 by a compression method leaving behind indentations 267 (instead of slots) on side walls 265S1 and 265S2 and aligned with tabs 257. Another method is to have metal plug shell 260 molded onto plug portion 254 (not snap-coupled as described) to achieve stronger performance.

Referring again to FIG. 3(A), locking ring 280 mounts on front handle wall 252F of housing structure 250, and serves to further secure metal plug shell 260 to housing structure 250. Locking ring 280 is a molded plastic structure having a peripheral collar 282 that attaches to corresponding mounting structures 258F formed on front handle wall 252F, and a front plate 284 defining a rectangular opening 287 that is substantially the same size as (or slightly larger than) metal plug shell 260. After metal plug shell 260 is attached to plug portion 254 in the manner described above, locking ring 280 is mounted by aligning opening 287 with metal plug shell 260, and sliding locking ring 280 over metal plug shell 260 until locking ring 280 contacts front handle wall 252F. As indicated in FIG. 5(B), locking ring 280 is then secured over front handle wall 252F by connecting (e.g., by snap-coupling) peripheral collar 282 to mounting structures 258F, whereby an inside edge of front plate 284 pinches or otherwise restrains inside edge 262R of metal plug shell 260, thereby further securing metal plug shell 260 to housing structure 250. Locking ring 280 also protects front wall 252F from potential damage caused during insertion into a host system.

Referring again to FIG. 3(A), rear cover 270 mounts on rear edge 252R of housing structure 250, and serves to secure PCBA 210 inside housing structure 250. Rear cover 270 includes a peripheral collar 272 extending from a rear cover plate 274, and a PCB support structure 275 that is provided on an inside surface of rear cover plate 274. As indicated in FIG. 5(B), after PCBA 210 is inserted into housing structure 250, rear cover 270 is mounted onto rear edge 252R of handle portion 251 over rear opening 253R such that peripheral collar 272 engages (e.g., becomes snap-coupled to) corresponding rear mounting structures 258R. In addition, PCB support structure 275 engages and supports a rear edge 112R of PCBA 210, thereby preventing movement of PCBA 210 inside housing structure 250, thus preventing ICs 135T and 135B from impacting upper and lower handle walls 252T and 252B, respectively, when the USB device is dropped or subjected to other mechanical shock.

As shown in FIGS. 3(A) and 3(B), PCBA 210 further includes a light-producing device (e.g., a light pipe) 137 that is mounted onto a corresponding fixture 138 provided on a rear edge of PCB 111, and end plate 274 of rear cover 270 defines an opening 277 that, when end cover 270 is mounted onto rear mounting structure 258R, is aligned with PCBA 210 such that light pipe 137 is visible through opening 277.

As shown in FIG. 3(A), key-chain holes 259 and 279 are respectively defined in side handle wall 252S1 of handle portion 251 and in rear cover 270. As indicated in FIG. 3(B), when rear cover 270 is mounted onto housing structure 250, key-chain holes 259 and 279 cooperate to provide a through hole for engaging a convenient key-chain or other carrying structure (indicated by dashed line).

Similar to conventional plug shells, metal plug shell 260 serves to protect metal contacts 120, and to facilitate connection of USB device 200 to a host female USB connector. As indicated in FIG. 6(A), gap distance G generally corresponds to a height H1 between metal contacts 28 and upper wall 23C of conventional standard female USB connector socket 22. Similarly, plug portion 254 and metal plug shell 260 are formed such that the upper surface of PCB plug section 114 (i.e., metal contacts 120) are spaced a predetermined distance T from the lower surface of bottom shell wall 265B, which distance T corresponds to a height H2 between metal contacts 28 and lower wall 23A of conventional standard female USB connector socket 22. Finally, shell side walls 265S1 and 265S2 of plug shell structure 260 are spaced apart by a width W1 that generally corresponds to the width W2 associated with side walls 23B-1 and 23B-2 of standard female USB connector socket 22. Accordingly, as indicated in FIG. 6(B), when inserted into standard female USB connector socket 22, PCB plug section 114, plug portion 254 and metal plug shell 260 are securely received in standard female USB connector socket 22 such that metal contacts 120 slide against and are contacted by corresponding metal contacts 28 of the female connector. In particular, PCB plug section 114, plug portion 254, and lower shell wall 265B are sized to be received in lower socket region 25A of female USB connector socket 22, with shell side walls 265S1 and 265S2 respectively received in side socket regions 25B-1 and 25B-2, and shell upper wall 265T received in upper socket region 25C.

Figure 7A:
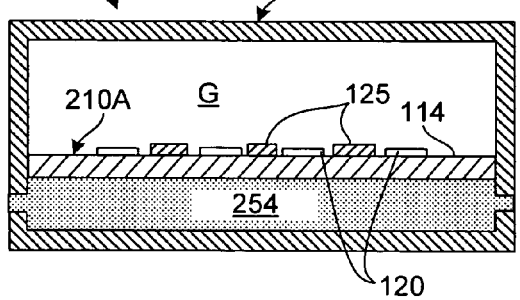
FIGS. 7(A) and 7(B) are cross-sectional side views showing a plug structure of an alternative USB device according to another embodiment of the present invention.
Figure 7B:
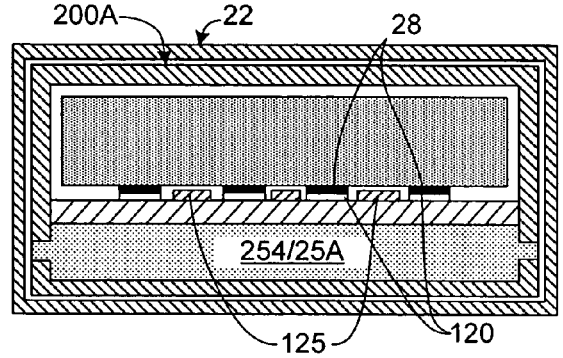

FIGS. 7(A) and 7(B) are simplified front views showing the plug portion of a USB device 200A according to a variation of the embodiment described above. Structures of USB device 200A that are identical to those of USB device 200 are identified with the same reference numerals, and will not be described in detail for sake of brevity. In accordance with another aspect, PCBA 210A includes elongated metal dividers 125 formed on the upper surface of PCB plug section 114, with each metal divider 125 being located between an adjacent pair of the metal contacts 120. Metal dividers 125 increase the rigidity of the plug structure, thus further enhancing the secure engagement between the plug structure and standard female USB socket connector 22, as indicated in FIG. 7(B).

The various USB device structures described herein may be modified to include different housing structures, such as those described in the following embodiments.

FIGS. 8 and 9 are exploded and assembled perspective views, respectively, showing a USB device 300 in accordance with another specific embodiment of the present embodiment. Structures and features of USB device 300 similar to those described above are identified with the same reference numerals for brevity. Referring to FIG. 9, USB device 300 includes a housing assembly 340 made up of an upper housing portion 350T and a lower housing portion 350B that are coupled together to form a housing structure similar to that described above. Housing assembly 340 also includes a locking ring 280 and a rear cover 270 (both described above). Referring to FIG. 8, lower housing portion 350B includes a lower handle portion 351B having a lower handle wall 352B and side handle wall portions 352S1B and 352S2B extending perpendicularly upward from side edges of lower handle wall 352B. Similarly, upper housing portion 350T includes an upper handle wall 352T and second side handle wall portions 352S1T and 352S2T that extend perpendicularly downward from upper handle wall 352T. During assembly, PCBA 210 is mounted onto lower housing portion 350B, and then upper housing portion 350T is mounted onto lower housing portion 350B such that side wall portions 352S1T and 352S2T mate with side wall portions 352S1B and 352S2B to form an enclosure over PCB body section 112. Metal plug shell 260, locking ring 280 and end cover 270 are then assembled onto associated ends of the resulting housing structure in a manner similar to that described above, thus completing the assembly process. Note that end cover 270 and locking ring 280 serve the additional function of holding upper housing portion 350T onto lower housing portion 350B. In particular, locking ring 280 is mounted onto front handle wall portions 352FT and 352FB of upper housing portion 350T onto lower housing portion 350B, respectively, over a rear edge 262R of metal plug shell 260. Alternatively, tabs 257 can be recessing (instead of protruding) on side walls 255S1 and 255S2. After proper alignment metal plug shell 260 can be fixedly attached to plug portion 254 by a compression method leaving behind indentations 267 (instead of slots) on side walls 265S1 and 265S2 and aligned with tabs 257 on. Another method is to have metal plug shell 260 molded to plug portion 254 (not snap-coupled) to achieve stronger performance.

FIGS. 10, 11 and 12 are exploded and assembled perspective views showing a USB device 400 in accordance with another specific embodiment of the present embodiment. Structures and features of USB device 400 similar to those described above are identified with the same reference numerals and detailed description is omitted from the following discussion for brevity. Referring to FIG. 10, USB device 400 includes a housing assembly 440 made up of a front housing portion 450F, a rear housing portion 450R, and a metal tube 441. Front housing portion 450F includes opposing upper and lower handle wall portions 452FT and 452FB and opposing side handle wall portions 452FS1 and 452FS2 that extend from a front handle wall 452F, and collectively define a first opening 453FR. A plug portion 454, which is substantially identical to the plug portions described above, extends from a front handle wall 452F, and includes tabs 457 that couple with slots 267 formed in metal plug shell 260 in the manner described above. Alternatively, tabs 457 can be recessing (instead of protruding) on side walls 455S1 and 455S2. After proper alignment metal plug shell 260 can be fixedly attached to plug portion 454 by a compression method leaving behind indentations 267 (instead of slots) on side walls 265S1 and 265S2 and are aligned with tabs 457. Another method is to have metal plug shell 260 molded to plug portion 454 (not snap-coupled) to achieve stronger performance. Rear housing portion 450R includes opposing upper and lower handle wall portions 452RT and 452RB and opposing side handle wall portions 452RS1 and 452RS2 that extend from a rear handle wall 452R, and collectively define a second opening (facing metal tube 441 in FIG. 10). Locking structures are provided on respective edges of rear housing portion 450R and front housing portion 450F to facilitate connection of the housing portions during assembly. In the current embodiment, locking fingers 458R extend from front edges of side handle wall portions 452RS1 and 452RS2 and mate with locking notches 458F1 and 458F2, respectively, which are formed in rear edges of side handle wall portions 452FS1 and 452FS2. Those skilled in the art will recognize that other locking mechanisms may also be used to secure front housing portion 450F to rear housing portion 450R, such as those disclosed in co-owned U.S. patent application Ser. No. 10/796,716, which is incorporated herein by reference in its entirety. Metal tube 441 including opposing upper and lower walls 442T and 442B integrally connected to respective upper and lower edges of opposing side walls 442S1 and 442S2, which collectively form a front edge 442F defining a front opening 443F and a rear edge 442R defining a rear opening 443R. During assembly, PCBA 210 is inserted into one of front housing portion 450F and rear housing portion 450R, with metal tube 441 either already mounted or subsequently mounted over upper/lower/side walls of the selected housing portion. The upper/lower/side walls of the other housing portion are then inserted into metal tube 441 until locking fingers 458R mate with locking notches 458F, thus securing housing assembly 440 together as indicated in FIGS. 11 and 12. Metal tube 441 thus provides both further protection to PCBA 210 and an esthetically desirable appearance to USB device 400.

As indicated in FIG. 10, USB device 400 utilizes a light-generating device 437 that mounts onto a rear wall 452R of rear housing portion 450R, and includes contacts that extend through an associated opening 477 to connect with corresponding connecting structure 138 formed on PCBA 210.

Figure 13:
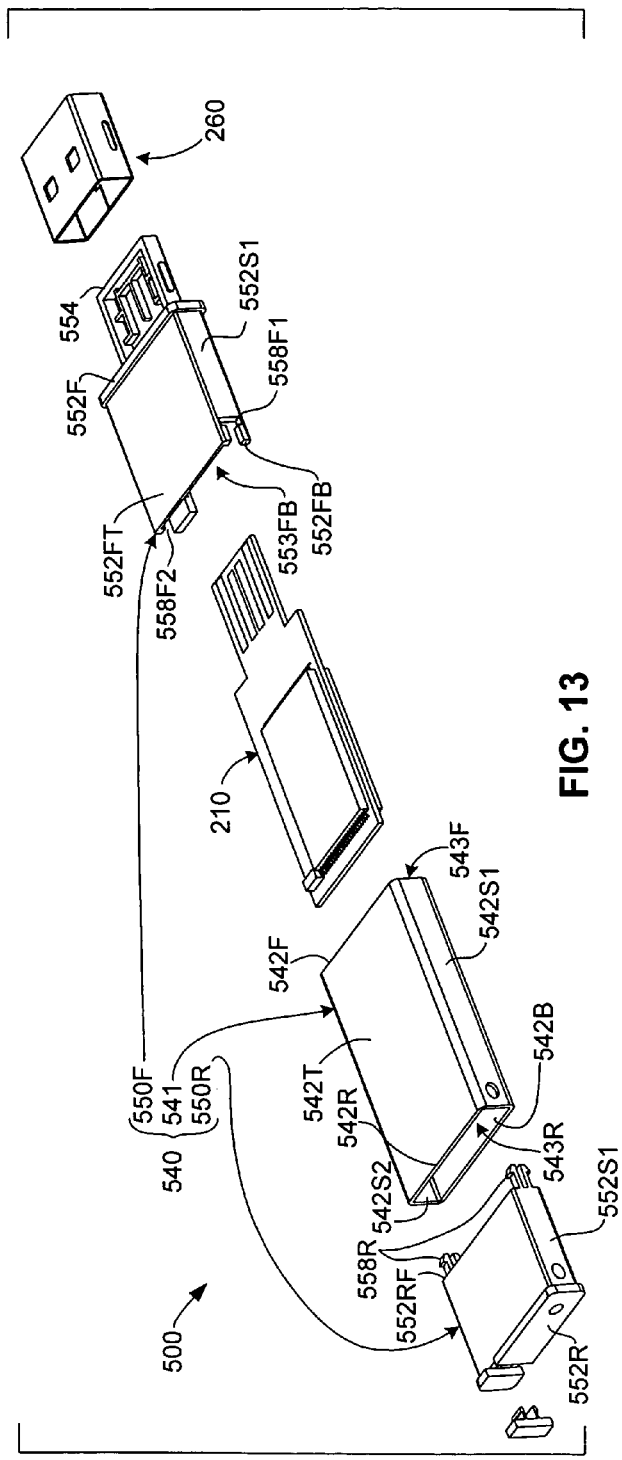
FIG. 13 is an exploded perspective view showing an exemplary USB device according to another embodiment of the present invention.
Figure 15:
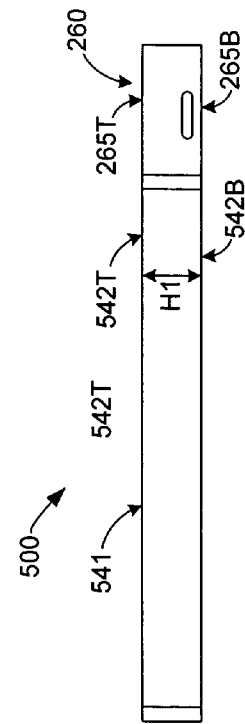
FIG. 15 is a simplified side elevation view showing the USB device of FIG. 13.
Figure 14:
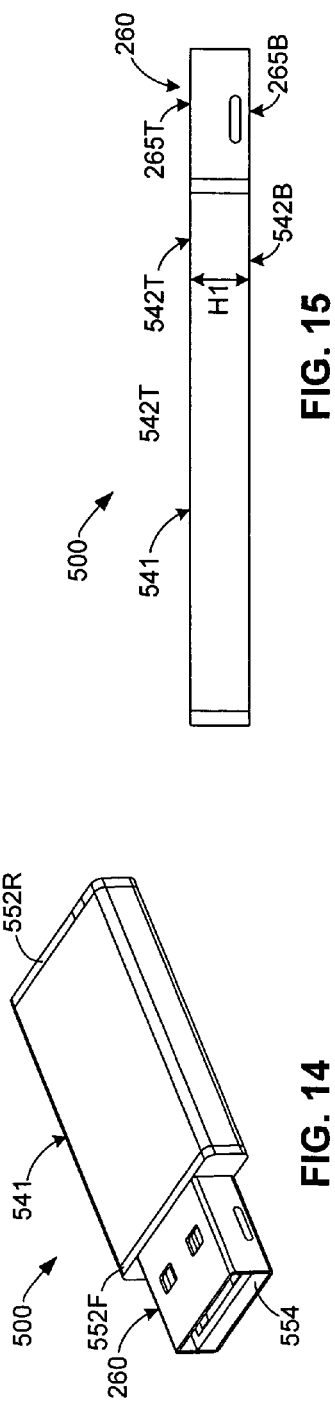
FIG. 14 is a top front perspective view showing the USB device of FIG. 13 in an assembled state.

FIGS. 13 and 14 are exploded and assembled perspective views showing a USB device 500 in accordance with another specific embodiment of the present embodiment. Structures and features of USB device 500 similar to those described above are identified with the same reference numerals for brevity. Referring to FIG. 13, USB device 500 is similar to USB device 400 (described above) in that it includes a housing assembly 540 made up of a front housing portion 550F, a rear housing portion 550R, and a metal tube 541 that are constructed and assembled substantially as described above. However, as indicated in FIG. 15, USB device 500 differs from USB device 400 in that opposing upper and lower walls 542T and 542B of metal tube 541 are respectively coplanar with the upper and lower walls 265T and 265B of metal plug shell 260, thus providing a low profile structure having a height H1 (e.g., 4.5 mm) that is essentially identical to the height of metal plug shell 260. By way of comparison, referring again to FIG. 11, metal tube 441 of "standard sized" USB device 400 has a height H2 of approximately 6.5 mm. Thus, USB device 500 has a relatively low "profile" relative to standard sized USB devices.

The low profile arrangement of USB device 500 is not limited to embodiments including metal tubes. For example, FIGS. 16-18 depict a USB device 600 having a housing assembly 640 including an integral housing structure 650 that is similar to that of USB device 200 (described above), but differs in that housing structure 650 has a handle portion 651 formed such that upper handle wall 652T and lower handle wall 652B are respectively coplanar with upper and lower walls 265T and 265B of metal plug shell 260, thus providing a low profile structure having a height H1 (e.g., 4.5 mm) that is essentially identical to the height of metal plug shell 260. Note that, in this low profile arrangement, the locking ring is omitted, and that rear cover 670 is mounted inside a rear opening 653R defined by handle portion 651. In addition, a low profile light pipe 637 is utilized to facilitate the lower profile.

The various USB device structures described herein may be further modified using appropriate ICs (e.g., ICs 130 and 135) to serve as convenient external storage for, for example, MP3 players (i.e., media storage for music), digital cameras, and mobile phones.

Figure 19:
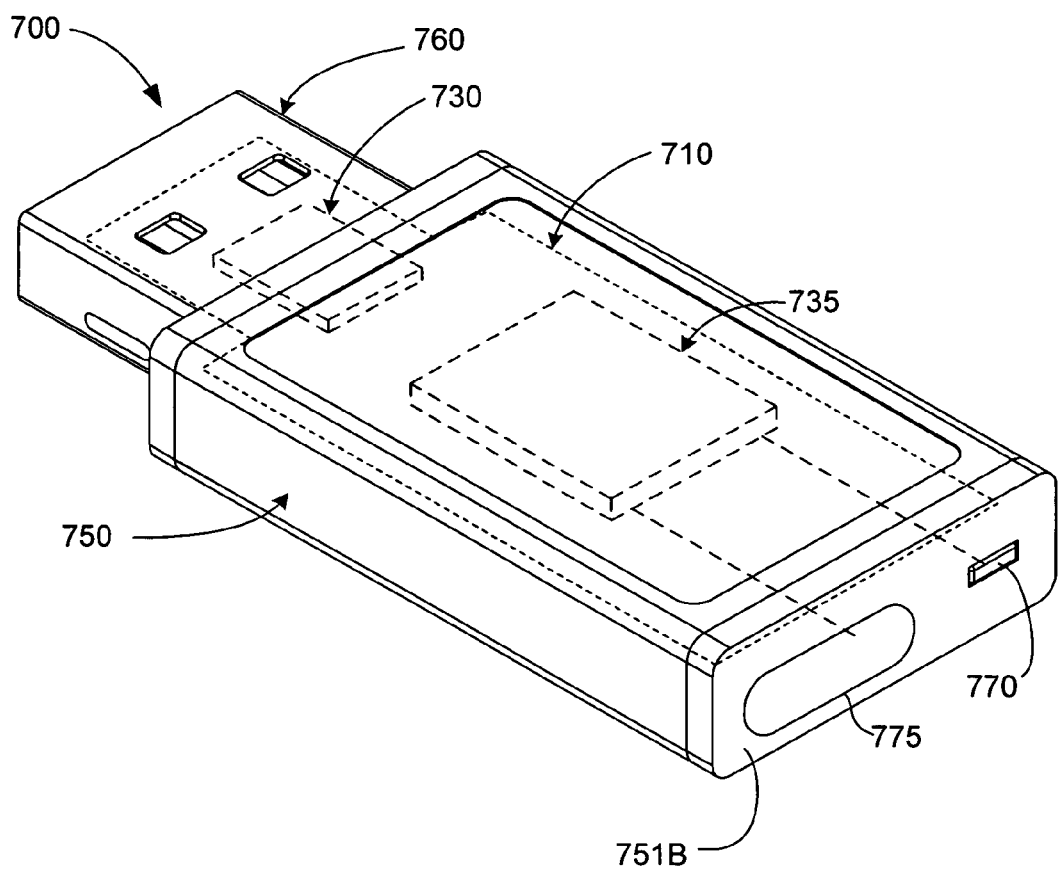
FIG. 19 is a perspective view showing a wireless communication-type USB device produced in accordance with another embodiment of the present invention.
Figure 20A:
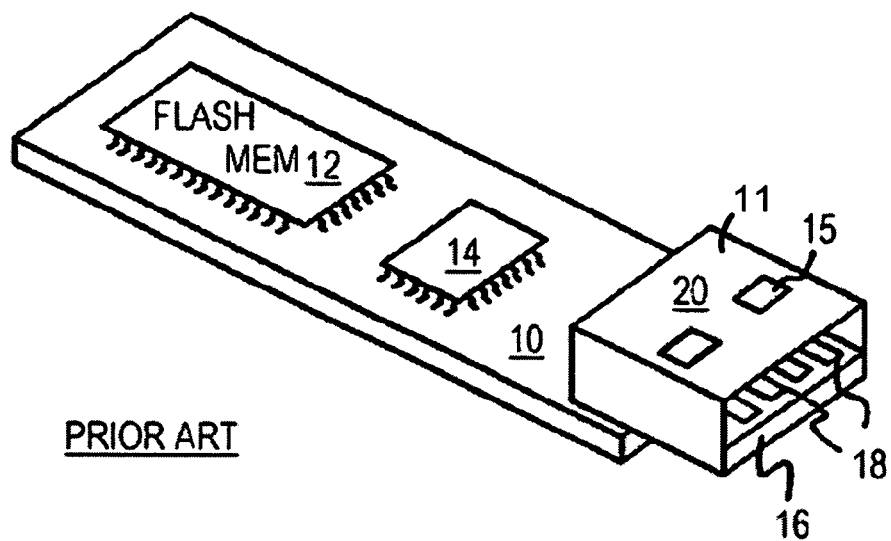
FIG. 20(A) shows a prior-art flash-memory card with a USB connector.
Figure 20B:
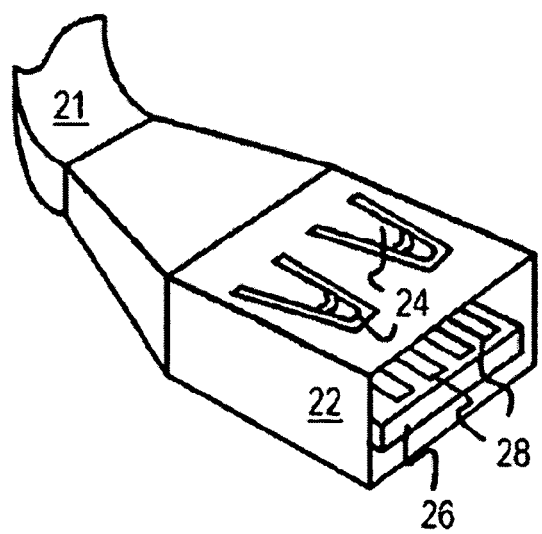
FIG. 20(B) shows a female USB connector.

In yet another embodiment, the disclosed USB device structures may be utilized to facilitate wireless communications. In this case, a USB device (e.g., Bluetooth USB adapter 700 shown in FIG. 19) may be plugged into the USB port of a host device, and may include a wireless communication device 735 that generates wireless signals emitted from a transceiver antenna 775, which may be provided on a back side of housing 750 to maximize the effect of signal transmission. Wireless communication device 735 communicates with a host (e.g., a computer) via USB control IC 730, and includes a Bluetooth controller, a radio frequency (RF) transceiver, a baseband controller, memory (e.g., EEPROM), a voltage regulator, a crystal, and a control circuit for controlling LED 770. These circuits may be combined together, along with passive circuits (e.g., resistors, capacitors and inductors) in a single chip, as depicted, or formed on one or more separate chips that are mounted on PCB 710 and enclosed by housing 750 and associated metal plug shell 760 that are connected together in the manner described above. Such an arrangement would facilitate communication between the host and a wireless communication device, such as a BlueTooth-enabled device. Bluetooth is a wireless technology that enables any electrical device to wirelessly communicate in the 2.4 GHz frequency band. It allows devices such as mobile phones, headsets, PDA's and computers to communicate and send data to each other without the need for wires or cables to link to devices together. It has been specifically designed as a low cost, low power, radio technology, which is particularly suited to the short range Personal Area Network (PAN) application. By plugging Bluetooth USB adapter 700 into the USB port, the Bluetooth USB adapter enables a non-Bluetooth electrical device (i.e., the host) to communicate with Bluetooth enabled devices. One specific wireless application may be a BlueTooth mouse device, which are used today for cursor pointing. Another application example is allowing computer user doing two-way communication to Bluetooth-wireless equipped mobile phones, PDA, keyboard, printer, digital camera, and MP3 player. Other applications may include wireless headsets. Yet another application may include enabling BlueTooth wireless connections inside an automobile to facilitate "hands free" operation of a mobile phone. Of course, other wireless communication protocols, such as IrDA infrared transmitting devices, may also be utilized in conjunction with USB devices of the present invention.

In addition to the specific housing arrangements described above with reference to the various disclosed embodiments, those skilled the art will recognize that other housing structures and connection methods may be used. For example, the upper and lower housing portions of FIG. 8 may be connected by way of ultrasonic welding. Accordingly, unless otherwise specified, the appended claims are not intended to be limited to the disclosed housing arrangements.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A Universal-Serial-Bus (USB) device comprising:
a printed circuit board assembly (PCBA) including:
a printed circuit board (PCB) including a relatively wide PCB body section and a relatively narrow PCB plug section, wherein the PCB has opposing upper and lower surfaces, a plurality of metal contacts disposed on the upper surface of the PCB plug section, and a plurality of integrated circuits (ICs) including at least one IC mounted on one of the upper surface and the lower surface of the PCB body section;
a plastic housing structure secured over the PCBA, the housing structure including a relatively wide handle portion and a relatively narrow plastic plug portion extending from a front handle wall of the handle portion, wherein the PCB body section is enclosed inside the handle portion, and wherein the PCB plug section extends through an opening defined by the front handle wall and is supported over a lower plug wall of the plug portion; and
a metal plug shell is fixedly connected to the housing structure such that an upper wall of the metal plug shell extends from the front handle wall over the plug portion, wherein the metal contacts of the PCB are exposed in a gap defined between the PCB plug section and the upper wall of the metal plug shell,
wherein the handle portion of the housing structure includes opposing upper and lower walls and opposing side walls that collectively define a housing chamber and include rear edges defining a rear opening,
wherein the PCBA is received in the housing chamber such that a rear edge of the PCB is located adjacent to the rear opening, and
wherein the USB device further comprises a rear cover mounted onto the rear edges of the handle portion, the rear cover including a PCB support structure extending through the rear opening and connected to the rear edge of the PCB.

2. The USB device according to claim 1, wherein the metal plug shell comprises opposing shell side walls respectively positioned along side walls of the plug portion, a lower shell wall integrally connected to lower ends of the shell side walls and positioned under the lower wall of the plug portion, and an upper shell wall integrally connected to upper ends of the first and second shell side walls and positioned over and spaced from the upper surface of the PCB plug section to form the predetermined gap.

3. The USB device of claim 2, wherein the PCBA comprises a lead-free structure.

4. The USB device according to claim 2,
wherein plug portion further comprises a plurality of protruding tabs,
wherein the metal plug shell defines a plurality of slots, and
wherein the metal plug shell is mounted on the plug portion such that each tab of the plug portion is received in a corresponding slot of the metal plug shell.

5. A Universal-Serial-Bus (USB) device comprising:
a printed circuit board assembly (PCBA) including:
a printed circuit board (PCB) including a relatively wide PCB body section and a relatively narrow PCB plug section, wherein the PCB has opposing upper and lower surfaces, a plurality of metal contacts disposed on the upper surface of the PCB plug section, and a plurality of integrated circuits (ICs) including at least one IC mounted on one of the upper surface and the lower surface of the PCB body section;
a plastic housing structure secured over the PCBA, the housing structure including a relatively wide handle portion and a relatively narrow plastic plug portion extending from a front handle wall of the handle portion, wherein the PCB body section is enclosed inside the handle portion, and wherein the PCB plug section extends through an opening defined by the front handle wall and is supported over a lower plug wall of the plug portion; and
a metal plug shell is fixedly connected to the housing structure such that an upper wall of the metal plug shell extends from the front handle wall over the plug portion, wherein the metal contacts of the PCB are exposed in a gap defined between the PCB plug section and the upper wall of the metal plug shell,
wherein the metal plug shell comprises opposing shell side walls respectively positioned along side walls of the plug portion, a lower shell wall integrally connected to lower ends of the shell side walls and positioned under the lower wall of the plug portion, and an upper shell wall integrally connected to upper ends of the first and second shell side walls and positioned over and spaced from the upper surface of the PCB plug section to form the predetermined gap, and
wherein the plastic housing structure further comprises a locking ring mounted onto the front handle wall over a rear edge of the metal plug shell.

6. The USB device according to claim 1, wherein the PCBA further comprises a USB controller IC mounted on the lower surface of the PCB and positioned such that at least a portion of the USB controller IC is attached to the relatively narrow PCB plug section.

7. The USB device according to claim 6, wherein the USB controller IC is at least partially located below the metal contacts.

8. The USB device of claim 1, further comprising a light-producing device mounted on the rear edge of the PCB, wherein the rear cover defines an opening that is aligned with the PCB such that the light-producing device is visible through the opening.

9. The USB device of claim 1, wherein at least one wall of the handle portion of the housing structure and the rear cover define corresponding key-chain holes for receiving a key chain therein.

10. The USB device of claim 1, wherein the plug portion of the housing structure comprises:
a plug lower wall; and
a plurality of plug support ribs mounted on an upper surface of the plug lower wall,
wherein the PCBA is mounted on the plug portion such that the PCB plug section abuts an upper surface of the plug support ribs.

11. The USB device of claim 1, wherein the PCB further comprises metal dividers formed on the upper surface of the PCB, each of the metal dividers being located between an adjacent pair of the metal contacts.

12. The USB device of claim 1, wherein the handle portion is integrally molded to the plug portion and includes opposing upper and lower walls that are integrally molded to opposing upper and lower edges of opposing side walls.

13. The USB device of claim 12,
wherein the metal plug shell further comprises a lower wall that is parallel to the upper wall and located under the plug portion of the housing structure, and
wherein the opposing upper and lower walls of the handle portion are respectively coplanar with the upper and lower walls of the metal plug shell.

14. The USB device of claim 1, wherein the housing structure comprises:
a lower housing portion including a lower handle portion having a lower handle wall and first side handle wall portions extending perpendicular to side edges of the lower handle wall;
an upper housing portion including an upper handle wall and second side handle wall portions extending perpendicular to the upper handle wall,
wherein the upper housing portion is mounted over the lower housing portion such that the first side wall portions mate with the second side wall portions to form an enclosure over the PCB body section.

15. The USB device of claim 14,
wherein the upper housing portion and the lower housing portion further comprise first and second front handle wall portions, respectively; and
wherein the USB device further comprises a locking ring mounted onto the first and second front handle wall portions over a rear edge of the metal plug shell.

16. A Universal-Serial-Bus (USB) device comprising:
a printed circuit board assembly (PCBA) including:
a printed circuit board (PCB) including a relatively wide PCB body section and a relatively narrow PCB plug section, wherein the PCB has opposing upper and lower surfaces, a plurality of metal contacts disposed on the upper surface of the PCB plug section, and a plurality of integrated circuits (ICs) including at least one IC mounted on one of the upper surface and the lower surface of the PCB body section;
a plastic housing structure secured over the PCBA, the housing structure including a relatively wide handle portion and a relatively narrow plastic plug portion extending from a front handle wall of the handle portion, wherein the PCB body section is enclosed inside the handle portion, and wherein the PCB plug section extends through an opening defined by the front handle wall and is supported over a lower plug wall of the plug portion; and
a metal plug shell is fixedly connected to the housing structure such that an upper wall of the metal plug shell extends from the front handle wall over the plug portion, wherein the metal contacts of the PCB are exposed in a gap defined between the PCB plug section and the upper wall of the metal plug shell,
wherein the housing structure comprises:
a front housing portion including opposing upper and lower handle wall portions and opposing side handle wall portions extending from the front handle wall;
a rear housing portion including opposing upper and lower handle wall portions and opposing side handle wall portions extending from a rear handle wall; and
wherein the USB device further comprises a metal tube including opposing upper and lower walls respectively mounted over the upper and lower handle wall portions of the front and rear housing portions, and opposing side walls respectively mounted over the side wall portions of the front and rear housing portions,
wherein the metal tube extends between the front handle wall and the rear handle wall, and
wherein the front housing portion is coupled to the rear housing portion inside the metal tube.

17. The USB device of claim 16,
wherein the metal plug shell further comprises a lower wall that is parallel to the upper wall and located under the plug portion of the housing, and
wherein the opposing upper and lower walls of the metal tube are respectively coplanar with the upper and lower walls of the metal plug shell.

18. The low-profile USB device of claim 1, wherein the ICs include a wireless communication device.

* * * * *